(12) United States Patent
Farber et al.

(10) Patent No.: US 9,772,639 B2
(45) Date of Patent: Sep. 26, 2017

(54) DYNAMIC CURRENT-LIMIT CIRCUIT

(71) Applicant: Dialog Semiconductor (UK) Limited, London (GB)

(72) Inventors: Martin Farber, Munich (DE); Jens Masuch, Munich (DE)

(73) Assignee: Dialog Semiconductor (UK) Limited, London (GB)

( * ) Notice: Subject to any disclaimer, the term of this patent is extended or adjusted under 35 U.S.C. 154(b) by 85 days.

(21) Appl. No.: 14/864,983

(22) Filed: Sep. 25, 2015

(65) Prior Publication Data

US 2016/0259355 A1    Sep. 8, 2016

(30) Foreign Application Priority Data

Mar. 5, 2015 (DE) ......................... 10 2015 204 021

(51) Int. Cl.
*G05F 1/565* (2006.01)
*G05F 1/00* (2006.01)
*G05F 1/575* (2006.01)
*H03K 5/24* (2006.01)

(52) U.S. Cl.
CPC ........... *G05F 1/575* (2013.01); *H03K 5/2481* (2013.01)

(58) Field of Classification Search
CPC .......... G05F 1/565; G05F 1/575; G05F 1/595
USPC ................ 323/241–243, 246, 274–277, 280, 323/282–285
See application file for complete search history.

(56) References Cited

U.S. PATENT DOCUMENTS

| | | | | |
|---|---|---|---|---|
| 6,650,093 B1 * | 11/2003 | Baldwin | ................. | G05F 1/613 323/224 |
| 6,842,068 B2 * | 1/2005 | Perrier | ................... | G05F 1/575 323/280 |
| 8,258,765 B2 * | 9/2012 | Nishida | ............... | H02M 3/1588 323/277 |
| 8,823,341 B2 | 9/2014 | Polarouthu et al. | | |
| 2004/0201369 A1 * | 10/2004 | Perrier | ................... | G05F 1/575 323/280 |
| 2006/0043946 A1 * | 3/2006 | Rose | ....................... | H02M 1/32 323/280 |
| 2007/0229160 A1 | 10/2007 | Beck | | |

(Continued)

FOREIGN PATENT DOCUMENTS

DE    10 2015 204 021.6    10/2015

OTHER PUBLICATIONS

German Office Action, 5 pgs., and English Language Translation, 4 pgs., File No. 10 2015 204 021.6, dated Apr. 18, 2016.

*Primary Examiner* — Adolf Berhane
*Assistant Examiner* — Gary Nash
(74) *Attorney, Agent, or Firm* — Saile Ackerman LLC; Stephen B. Ackerman

(57) ABSTRACT

A comparator circuit is described, which is configured to provide a control current and a control voltage based on a first input voltage and a second input voltage. The comparator circuit comprises an input amplifier configured to generate an output signal based on the first input voltage and the second input voltage, and offset means configured to generate a first offset. Furthermore, the comparator circuit comprises a first output circuit configured to generate the control current based on the output signal and based on the first offset. In addition, the comparator circuit comprises a second output circuit configured to generate the control voltage based on the output signal and not based on the first offset.

23 Claims, 13 Drawing Sheets

(56) References Cited

U.S. PATENT DOCUMENTS

2009/0001952 A1\* 1/2009 Chang ................... H02M 3/156
  323/280
2010/0156385 A1\* 6/2010 Werking ............. H03F 3/45475
  323/313
2014/0022015 A1\* 1/2014 Werking ............. H03F 3/45183
  330/253

\* cited by examiner

DYNAMIC CURRENT-LIMIT CIRCUIT

TECHNICAL FIELD

The present document relates to DC-DC power converters. In particular, the present document relates to DC-DC power converters which are operated in a plurality of different operating modes.

BACKGROUND

Buck converters are an example for a DC-DC power converter. A buck converter may be operated in one or more modes, notably in a PFM (pulse frequency modulation) or in a PWM (pulse width modulation) mode. The PFM mode is typically used for relatively low load currents and the PWM mode is used for relatively high load currents.

FIG. 1 illustrates an example buck converter 100 which comprises a high side switch 106 (e.g. a PMOS, i.e. p-type metal oxide semiconductor, transistor) and a low side switch 107 (e.g. an NMOS, i.e. an n-type MOS, transistor). The switches 106, 107 are driven using respective gate drivers 104, 105. Furthermore, the buck converter 100 comprises an inductor 110 (e.g. a coil) which may be coupled to an integrated circuit (IC) comprising the switches 106, 107 via a pin 111. In addition, the buck converter 100 may comprise an output capacitor 112 which is arranged in parallel to an output of the buck converter 100.

In PFM mode, the buck converter 100 turns on the high side switch 106, when the output voltage 127 of the buck converter 100 falls below a reference voltage 122, which may be provided e.g. by a voltage DAC 101 (i.e. a voltage digital-to-analog-converter). In particular, the high side switch 106 may go into on-state, if it is detected by the comparator 102 that the feedback voltage 121 (which is derived from the output voltage 127 and/or which may be proportional or equal to the output voltage 127) falls below the reference voltage 122. This situation may be indicated by the under-voltage signal 123 at the output of the comparator 102.

Within the PFM mode, the high side switch 106 is turned off, when the current in the inductor 110 reaches a threshold value which may be referred to as a sleep current-limit or as a reference current 126. For this purpose, the buck converter 100 may comprise a current sense circuit 108 which is configured to monitor the current through the inductor 110. In particular, the current sense circuit 108 may be configured to provide a sensed current 128 which is indicative of (e.g. proportional or equal to) the current through the inductor 110. The sensed current 128 may be compared with a (fixed) reference current 126 (which is indicative of the sleep current-limit) to provide a current-limit signal 124, which is indicative of whether the sensed current 128 is greater than or smaller than the reference current 126.

As such, the high side switch 106 may be controlled using a control circuit 103 based on the current-limit signal 124 (for putting the high side switch 106 into off-state) and based on the under-voltage signal 123 (for putting the high side switch 106 into on-state).

The low side switch 107 may be turned on (i.e. may be put into on-state), when the high side switch 106 is turned off, in order to ensure that the high side switch 106 and the low side switch 107 are not in on-state concurrently. Furthermore, the low side switch 107 may be turned off, when the current in the inductor 110 is fully discharged. This condition may be detected based on the current-limit signal 124.

In particular, in this case, the reference current 126 may be set to zero during the on-phase of the low side switch 107.

The PFM mode is typically not used for relatively large currents, and by consequence the current-limit, which is set by the reference current 126, is normally set relatively low to maximize efficiency of the buck converter 100 and to minimize the output ripples of the current/voltage at the output of the buck converter 100.

In PWM mode, the high side switch 106 is turned on based on a clock signal (which defines a certain pulse width). Furthermore, the high side switch 106 is turned off using a control loop (e.g. based on a pre-determined peak current through the inductor 110). In PWM mode, the low side switch 107 is typically controlled in a complementary manner with respect to the high side switch 106. In particular, the low side switch 107 is typically switched on, whenever the high side switch is off.

The PFM mode may be used for relatively low load currents and the PWM mode may be used for relatively high load currents. Problems may occur in case of load transients, e.g. when the load current rapidly increases from a relatively low value (when the power converter 100 is operated in PFM mode) to a relatively high value (when the power converter 100 should be operated in PWM mode). In such a situation, the output voltage 127 may decrease substantially (especially in the case if the load current increases to a value higher than the one given by the fixed reference current mentioned above) and the power converter 100 may not be able to perform a transition to PWM mode sufficiently fast, in order to provide the requested load current.

SUMMARY

The present document addresses the technical problem of enabling a smooth mode transition between different operation modes of a power converter 100. In particular, the present document addresses the technical problem of providing one or more control signals (e.g. an under-voltage signal 123 or a current-limit signal 124) which enable a control circuit 103 of a power converter 100 to provide a smooth mode transition between different operation modes of a power converter 100. According to an aspect, a comparator circuit is described, which is configured to provide a control current (e.g. a reference current) and a control voltage (e.g. an under-voltage signal) based on a first input voltage (e.g. a feedback voltage) and a second input voltage (e.g. a reference voltage). The comparator circuit may combine the function of a comparator for generating an under-voltage signal and an operational transconductance amplifier (OTA) for generating an adjustable reference current. As such, the comparator circuit may be used within a DC-DC power converter for generating an under-voltage signal and a current-limit signal which are used for controlling the power converter within different operating modes.

The comparator circuit comprises an input amplifier which is configured to generate an output signal based on the first input voltage and the second input voltage. In particular, the input amplifier may be configured to provide a first output signal and a second output signal. The input amplifier may be configured to apply a gain, wherein the gain is greater than one if it is a voltage amplifier. By way of example, the input amplifier may comprise a differential pair with a first input transistor (e.g. a MOS transistor) which is controlled using the first input voltage and with a second input transistor (e.g. a MOS transistor) which is controlled using the second input voltage. The first output signal may be dependent on a current through the first input transistor and the second output signal may be dependent on a current through the second input transistor. Furthermore, the comparator circuit comprises offset means which are configured to generate a first offset. The first offset may be used to set a desired level of the control current for a particular delta voltage, i.e. for a particular difference between the first input voltage and the second input voltage. The delta voltage may also be referred to as a voltage difference.

The comparator circuit further comprises a first output circuit which is configured to generate the control current based on the output signal and based on the first offset. In particular, the first output circuit may be configured to generate a control current that is substantially linear with regards to the delta voltage, i.e. with regards to the difference between the first input voltage and the second input voltage.

In addition, the comparator circuit comprises a second output circuit which is configured to generate the control voltage based on the output signal and not based on the first offset.

As such, the comparator circuit is configured to generate a control voltage and a control current using the same pre- or input amplifier. The control voltage and the control current may e.g. be used to control a PFM operating mode of a power converter. In particular, the control voltage may be used for switching on the high side switch of the power converter and the control current may be used for switching off the high side switch. By making use of a common input amplifier design, test and/or trimming efforts may be relaxed. As a result of this, the level of the control current at the moment when the control voltage indicates an under-voltage and/or panic situation may be well aligned to allow for a precise operation of the power converter and a smooth transition between e.g. a fixed sleep/PFM mode and a dynamic sleep/PFM mode.

As indicated above, a delta voltage may correspond to a difference between the first input voltage and the second input voltage. The second output circuit may be configured to generate the control voltage such that the control voltage exhibits a swing from a first potential to a second potential at a first delta voltage (e.g. at a delta voltage which equals zero). The second output circuit may provide the function of a voltage comparator. The swing may e.g. be used as a trigger to turn on the high side switch of a power converter. Furthermore, the first output circuit may be configured to generate the control current such that the control current is substantially linear for delta voltages within a pre-determined interval around the first delta voltage. In addition, the control current may be generated such that it exhibits a first current value at the first delta voltage, wherein the first current value is dependent on the first offset. In other words, the first offset may be used to set the level of the control current for a particular delta voltage. The first output circuit may provide the function of an operational transconductance amplifier.

The second output circuit may comprise an upper transistor (e.g. a MOS transistor) which is coupled to a supply voltage and a lower transistor (e.g. a MOS transistor) which is coupled to ground. The upper transistor and the lower transistor are arranged in series. The lower transistor may be controlled using the first output signal and the upper transistor may be controlled using the second output signal (of the input amplifier). The control voltage may be dependent on a level of a midpoint between the lower transistor and the upper transistor. In particular, the first and second output signal may be configured to control a current through the lower and upper transistor, respectively, and the level at the midpoint may be high (i.e. at the supply voltage) or low (i.e. at ground) in dependence of a difference between the currents through the lower and upper transistor.

The first output circuit may also be configured to generate the control current based on the level of the midpoint between the lower transistor and the upper transistor and based on the first offset. Hence, the first output circuit may also make use of the comparison between the first and the second output signal, which is provided by the second output circuit. By doing this, a misalignment between the control current and the control voltage may be further reduced.

In particular, the first output circuit may be coupled to the midpoint between the lower transistor and the upper transistor via a diode function (e.g. for generating the second output), wherein the diode function exhibits a forward voltage drop. In particular, the diode function may be bi-directional and may exhibit a forward voltage drop for current from the midpoint between the lower transistor and the upper transistor towards the first output circuit and vice versa. The diode function may e.g. be provided by one or more MOS transistors.

The comparator circuit may further comprise second offset means which is configured to generate a second offset. In addition, the comparator circuit may comprise a third output circuit which is configured to generate a second control voltage based on the output signal and based on the second offset. The (first) control voltage and/or the control current may be independent of the second offset. The second control voltage may exhibit a swing at a different delta voltage than the (first) control voltage which is generated by the second output circuit. The difference between the delta voltage of the second output circuit and the third output circuit may be set by the second offset.

According to a further aspect, a DC-DC power converter is described, which is configured to provide an output current at an output voltage to a load at an output of the DC-DC power converter. The DC-DC power converter comprises a high side switch and a low side switch, which are arranged in series between a supply voltage and ground. Furthermore, the power converter comprises an inductor which is arranged to couple a midpoint between the high side switch and the low side switch to the output of the DC-DC power converter. In addition, the power converter comprises a (digital) control circuit (e.g. a microcontroller) which is configured to switch on or off the high side switch based on an under-voltage signal and based on a current-limit signal. In addition, the power converter comprises a feedback loop configured to provide a feedback voltage based on the output voltage and a current sense circuit which is configured to provide a sensed current that is indicative of a current through the inductor.

Furthermore, the power converter comprises a comparator circuit as described in the present document. The comparator circuit is configured to provide the under-voltage signal (e.g. as a control voltage) and a reference current (e.g. as a control current) based on the feedback voltage (i.e. the first input voltage) and based on a reference voltage (i.e. the second input voltage). The current-limit signal may be dependent on the sensed current and on the reference current. By way of example, the sensed current may be compared with the (possibly adjustable) reference current and the current-limit signal is dependent on the outcome of this comparison.

The control circuit may be configured to turn on the high side switch, if the under-voltage signal indicates that the feedback voltage is lower than the reference voltage by at least a pre-determined under-voltage threshold. Furthermore, the control circuit may be configured to turn off the high side switch, if the current-limit signal indicates that the sensed current reaches the reference current. In addition, the control circuit may be configured to maintain the high side switch off for at least a pre-determined off-time (e.g. a minimum off-time). If the under-voltage is not reached before the inductor current reaches zero, the low side switch may be turned off exactly at this point. As such, the control circuit may be configured to operate the power converter in a fixed or in a dynamic sleep mode.

The comparator circuit may be configured to determine whether the feedback voltage is lower than the reference voltage by at least a pre-determined panic threshold. The panic threshold may be set using one or more offsets within the comparator circuit. The comparator circuit (notably an OTA circuit) may be configured to generate a fixed reference current, if the feedback voltage is not lower than the reference voltage by at least the pre-determined panic threshold. As a result of this, the power converter may be operated in a fixed sleep or PFM mode.

Furthermore, the comparator circuit may be configured to generate an adaptive reference current which is dependent on a difference between the feedback voltage and the reference voltage, if the feedback voltage is lower than the reference voltage by at least the pre-determined panic threshold. As such, the power converter may be operated in a dynamic sleep mode, e.g. in order to provide increased load currents to the load of the power converter.

As indicated above, the comparator circuit typically comprises offset means which are configured to provide one or more offsets. The pre-determined panic threshold and the reference current may be dependent on or may be set using the one or more offsets. The one or more offsets may be such that the adaptive reference current substantially corresponds to the fixed reference current, if the feedback voltage is lower than the reference voltage by the pre-determined under-voltage threshold or panic threshold. By doing this, a smooth transition between the fixed sleep mode and the dynamic sleep mode may be achieved.

According to a further aspect, a method for providing a control current and a control voltage based on a first input voltage and based on a second input voltage is described. The method comprises generating an output signal based on the first input voltage and the second input voltage, and generating a first offset. Furthermore, the method comprises generating the control current based on the output signal and based on the first offset, and generating the control voltage based on the output signal and not based on the first offset.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein

FIGS. 5a-1, 5a-2, 5a-3 show a circuit diagram of another example comparator circuit;

DESCRIPTION

As indicated above, the present document is directed at providing a flexible and smooth transition between different operating modes of a power converter 100, e.g. in case of a load transient.

Figure 1:
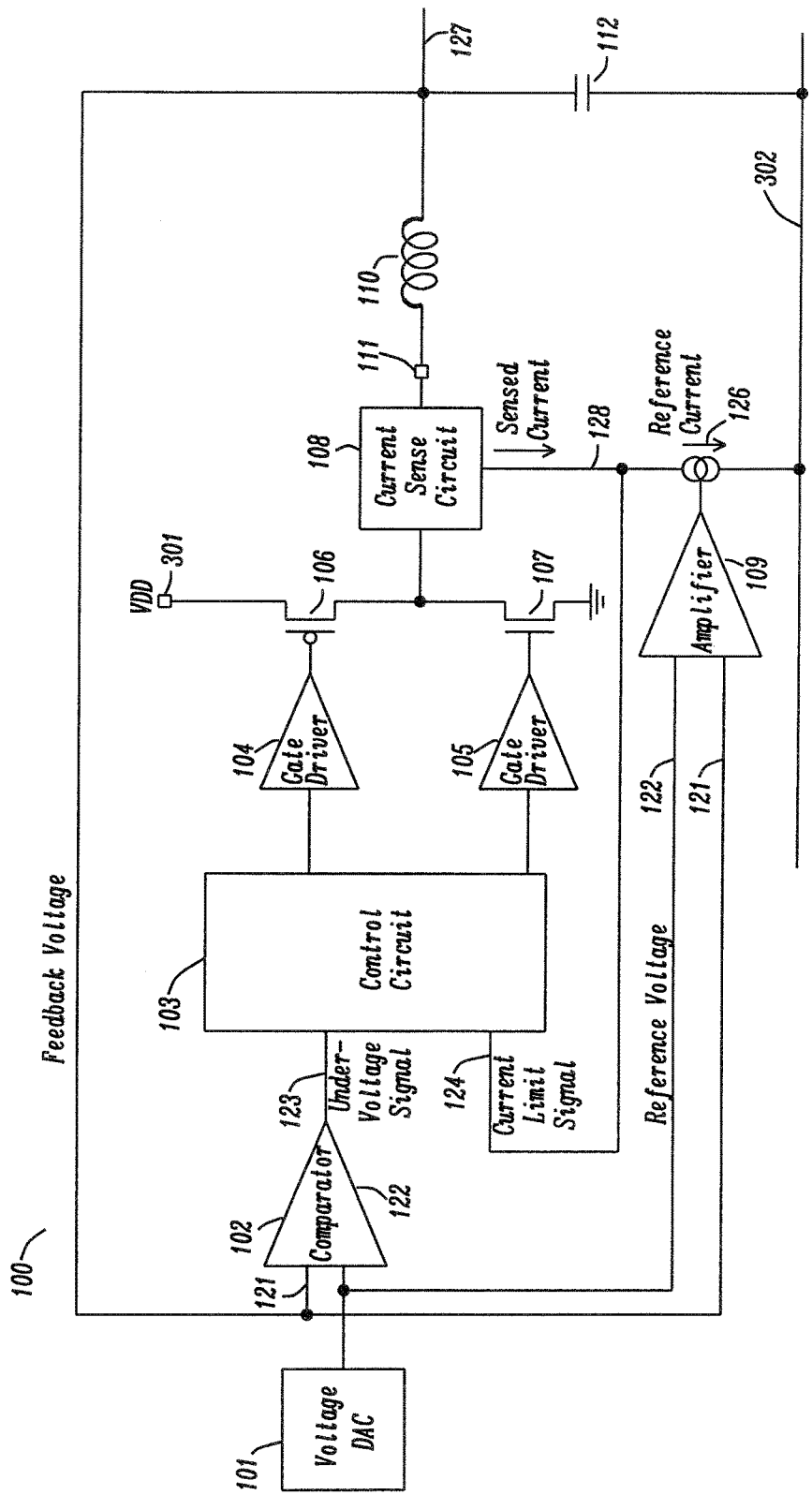
FIG. 1 shows a block diagram of an example power converter.

In order to cope with increased load currents, the buck converter 100 of FIG. 1 may be operated in further operating modes. In particular, the buck converter 100 may be operated in a modified PFM mode which may be referred to as a "dynamic sleep mode". In this mode, the buck converter 100 operates in PFM mode, but the current-limit which is set by the reference current 126 is adjustable. In particular, the reference current 126 may be controlled using an amplifier 109 which compares the feedback voltage 121 with the reference voltage 122. The amplifier 109 may comprise an operational transconductance amplifier (OTA) or a voltage controlled current source. By using an amplifier 109, the reference current 126 may be increased as the feedback voltage 121 (and/or the output voltage 127) decreases (relative to the reference voltage 122). By doing this, the buck converter 100 may be enabled to cope with (relatively) large output currents. By way of example, a maximum output current out of the power converter 100 may also be provided within the modified PFM mode.

As such, FIG. 1 shows the basic function of a dynamic sleep mode. In the dynamic sleep mode, the high side switch 106 turns on, whenever the feedback voltage 121 falls below the reference voltage 122. As indicated above, the feedback voltage 121 may be scaled by a resistor divider such that the reference voltage 122 is a scaled version of the target output voltage. As a result of turning on the high side switch 106, the inductor current through the inductor 110 ramps up. When the reference current 126 (which is set by the amplifier 109) is met or when the reference current 126 is equal to the sensing current 128 the high side switch 106 turns off and the low side switch 107 turns on. The high side switch 106 may then be held off for a fixed amount of time, which may be referred to as the minimum off-time. Once the minimum off-time has expired, the low side switch 107 may be turned off and the high side switch 106 is allowed to turn back on again, e.g. subject to the feedback voltage 121 falling back below the reference voltage 122.

When the load current is relatively high, a situation may occur where the feedback voltage 121 is always below the reference voltage 122 such that the high side switch 106 is always ready to turn on, as soon as the minimum off-time has expired. As a result of this, one of the pass-devices 106, 107 is always on, and the inductor current through the inductor 110 is continuous (if the value chosen for the minimum off-time is no longer greater than the inductor discharge time which is required to completely discharge the energy comprised within the inductor 110).

In a fixed sleep mode, the reference current 126 (which is used to turn off the high side switch 106) is fixed. In a dynamic sleep mode, the reference current 126 is allowed to vary to enable the power converter 100 to support very high load currents.

The power converter 100 may comprise a current sense circuit 108 which is configured to sense the output current when the high side switch 106 is on. The sensed current 128 is compared to the reference current 126. When the sensed current 128 is higher than the reference current 126, the current-limit is triggered (via the current-limit signal 124) and the high side switch 106 is turned off.

As indicted above, the reference current 126 is fixed in the fixed sleep mode. In the dynamic sleep mode the reference current 126 is modulated by the amplifier 109 which compares the feedback voltage 121 with the reference voltage 122. When the feedback voltage 121 falls further below the reference voltage 122, the reference current 126 is increased, and as a result of this, the limit of the current through the inductor 110 is increased.

The dynamic sleep amplifier 109 (e.g. the OTA) controls the dynamic current-limit by providing an adequate reference current 126. When operating in fixed sleep mode, this reference current 126 can either be clamped to a minimum value or may be provided by a further current source that is configured to provide a constant reference current. The current-limit is typically only allowed to increase, in a situation where the feedback voltage 121 has fallen at least by a pre-determined threshold value (which may be referred to as a "panic threshold"). Such a panic threshold may be used to prevent a toggling between the fixed sleep mode and the dynamic sleep mode.

In order to move from a fixed PFM mode (or a fixed sleep mode) to a dynamic sleep mode, the power converter 100 may be configured to detect a situation, where the feedback voltage 121 falls below the panic threshold. As a result of this, a panic signal may be generated by a panic comparator (not shown in FIG. 1) which is configured to determine whether the feedback voltage 121 falls below the reference voltage 122 by more than the panic threshold.

In order to move back from the dynamic sleep mode to the normal PFM mode, the reference current 126 may be clamped to a minimum value and the density of the output current pulses which are generated by the power converter 100 may be monitored (e.g. using the current sense circuit 108). If the time interval between the on-pulses of the high side switch 106 becomes longer than the minimum off-time or longer than a fixed off-time, the power converter 100 may revert back to a normal PFM mode. In order to allow for a smooth transition, the minimum reference current 126 which is used in the dynamic sleep mode may be identical or lower to the fixed reference current 126 which is used in the normal PFM mode. The transition between the fixed and dynamic modes should occur at a particular value of the feedback voltage 121, wherein the value of the feedback voltage 121 may be set using a voltage offset at the input of the amplifier 109.

As such, a smooth transition between a PFM mode (using a fixed reference current 126) and a dynamic sleep mode (using an adjustable reference current 126 that depends on the difference between the feedback voltage 121 and the reference voltage 122) may be dependent on one or more of the following:

a panic offset (also referred to herein as a second offset) used by a panic comparator, wherein the panic offset may be used to detect a panic. situation where the feedback voltage 121 falls below the reference voltage 122 at least by a predetermined panic threshold. The panic offset may be used to set the panic threshold.
  a reference current offset (also referred to as a first offset) which is used to ensure a smooth transition between a fixed reference current 126 and an adjustable reference current 126.
  the under-voltage threshold which is used by the comparator 102 to set the under-voltage signal 123.
  the level of the fixed reference current 126.
  the length of the minimum off-time.

It may be difficult to set these offsets and/or parameters in a precise manner, thereby generating discontinuities during mode transition. By way of example, the ripples of the output current of the power converter 100 within the dynamic sleep mode may not be well controlled, if the under-voltage comparator 102 does not detect an under-voltage situation when the minimum off-time expires. Such a situation may occur if the OTA 109 sets a reference current 126 which is too high for the case when the feedback voltage 121 is equal to the reference voltage 122. As a consequence, the sensed current 128 does not reach the reference current 126 and the current-limit signal 124 is not set, even though the feedback voltage 121 is equal to or above the reference voltage 122. By consequence, the high side switch 106 remains on, thereby increasing the ripple of the output current.

In another situation, the reference current 126 which is set by the OTA 109 may be too low during the transition from the dynamic sleep mode to the PFM mode. This leads to an additional drop of the output voltage 127/feedback voltage 121. The output voltage 127/feedback voltage 121 continues to drop until the current-limit determined by the reference current 126 reaches an adequate value for the load current. As such, a step down of the output voltage 127 may occur during the transition between the dynamic sleep mode and the PFM mode.

The fixed reference current 126 may be set such that the buck converter 100 may be unable to support certain output currents, when in fixed sleep mode or PFM mode. If within the dynamic sleep mode the OTA 109 tries to regulate using an output voltage 127/feedback voltage 121 which is higher than the under-voltage threshold that is used by the comparator 102, then the under-voltage signal 123 may still be low after the minimum off-time (respectively a longer fixed off-time) and the condition for switching back to the PFM mode is fulfilled. As a result of this, the power converter 100 may bounce in and out of the dynamic sleep mode repeatedly.

In order to allow for a precise setting of the different offsets and thresholds, the comparator circuit which is used for generating the under-voltage signal 123, the current-limit signal 124 and a panic signal may share common parts. In particular, the dynamic sleep mode OTA 109, the under-voltage comparator 102 and the panic comparator (not shown in FIG. 1) may share common parts. This allows improving the control over the offsets between the different comparators.

As outlined above, the offset between the under-voltage comparator 102 (which may also be referred to as a sleep comparator), the panic comparator and the voltage-to-current comparator 109 should be controlled in order to allow for a smooth transition between a PFM mode and a dynamic sleep mode.

Figure 2:
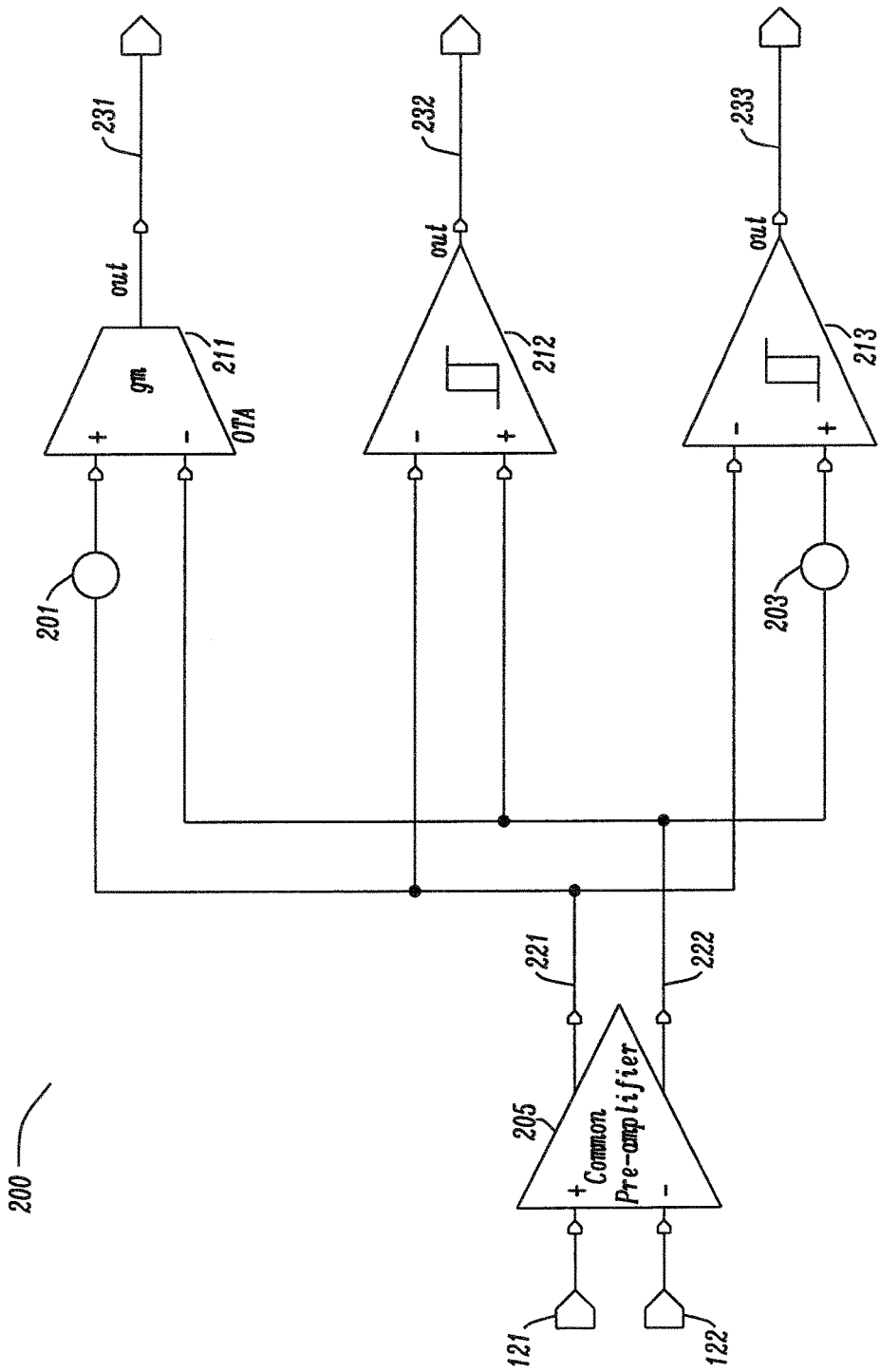
FIG. 2 shows a block diagram of an example comparator circuit for providing aligned control signals for a mode transition.

By combining the dynamic current-limit OTA 109 with the sleep/panic comparators, the thresholds which are used by the different circuits may be controlled. In particular, the input of the different comparators 102, 109 may be shared. Also other elements of the comparators between the respective inputs and outputs may be shared. This is illustrated in FIG. 2, where a common pre-amplifier 205 is used to analyse the feedback voltage 121 and the reference voltage 122. The pre-amplifier 205 may be configured to amplify the feedback voltage 121 and the reference voltage 122 and in particular a difference between the feedback voltage 121 and the reference voltage 122.

The pre-amplifier 205 may e.g. comprise a differential input stage and the differential input stage may be used jointly for the under-voltage comparator 102, the panic comparator and the OTA 109. The pre-amplifier 205 may provide amplified signals 221, 222 (referred to herein as output signals) which are input to respective output circuits 211, 212, 213 for generating a control current 231, 126, a first control voltage 232 (e.g. the under-voltage signal 123), and a second control voltage 233 (e.g. the panic signal).

It can be seen that the joint comparator circuit 200 may comprise a first offset unit 201 which is configured to set the reference current offset (also referred to as the first offset) and a second offset unit 203 which is configured to set the panic offset (also referred to as the second offset). If the pre-amplifier 205 applies a gain to the feedback voltage 121 and the reference voltage 122, then a misalignment of the offsets is divided by the gain and may therefore become negligible. The pre-amplifier 205 may have a single ended output which is provided to the different output circuits 211, 212, 213.

The control current 231 which is output by the OTA output circuit 211 may be directly provided to a reference device which is arranged in parallel to the high side switch 106. Alternatively, the control current 231 may be provided to an additional circuit with is configured to clamp and to provide current distribution functions. Thus, depending on the requirements, the polarity of the OTA output circuit 211 may be changed and the control current 231 may be adapted (e.g. a limit or a centre value of the control current 231 may be adapted).

In the following, example implementations of comparator circuits 200 are described. These comparator circuits 200 may have two-stage configurations and/or may comprise a pre-amplifier 205. The comparator circuits 200 which are illustrated in the following Figures are simplified circuits which may additionally comprise a hysteresis, one or more cascodes and/or power down transistors, etc. The currents and mirror ratios that are used within the different comparator circuits 200 may be changed. The currents which may be indicated in the following are the current which are flowing in an equilibrium state, when the feedback voltage 121 is equal to the reference voltage 122.

Figure 3A:
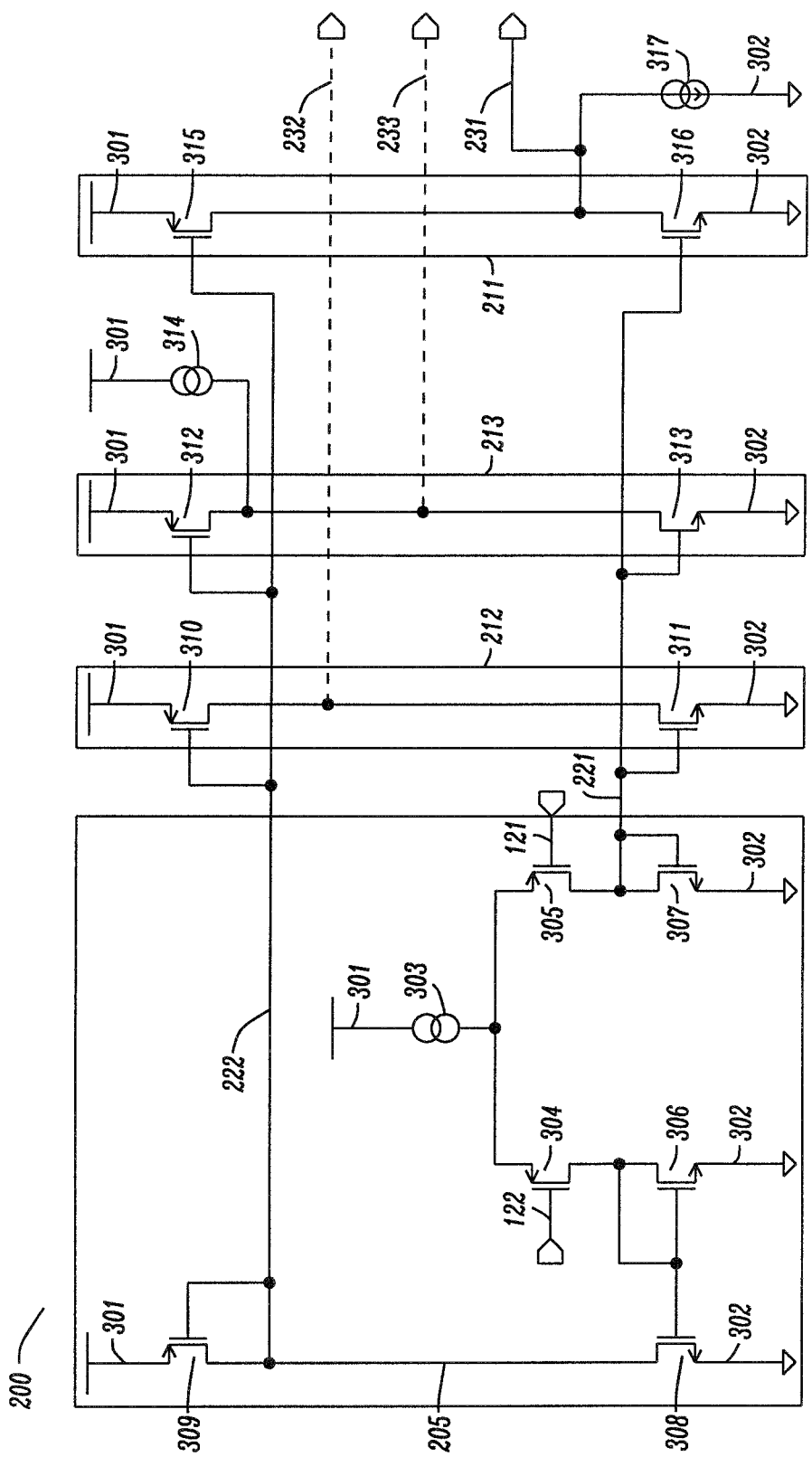
FIG. 3a shows a circuit diagram of an example comparator circuit.

FIG. 3a shows a comparator circuit 200 which makes use of the same differential pair 303, 304, 305, 306, 307 between the supply voltage VDD 301 and ground 302 at the input of the comparator circuit 200. Furthermore, the current mirror 306, 308 is shared. As a result of this, offsets between the different comparators may be reduced. In the illustrated example, the pre-amplifier 205 comprises the transistors 306, 307, 308 (e.g. n-type MOS transistors) and the transistors 304, 305, 309 (e.g. p-type MOS transistors). All these transistors may exhibit a size m=1. The output signals 221, 222 of the pre-amplifier 205 are provided at the midpoint between the transistors 308, 309 and at the midpoint between the transistors 305, 307, respectively.

The second output circuit 212 for generating the first control voltage 232 may comprise transistors 310 and 311 (e.g. MOS transistors), which are controlled using the output signals 221, 222, respectively, to compare the output signals 221, 222. In a similar manner, the third output circuit 213 for generating the second control voltage 233 may comprise transistors 312, 313 (e.g. MOS transistors), which are controlled using the output signals 221, 222, respectively, to compare the output signals 221, 222. This comparison may be offset by the panic offset which may be generated by a panic offset current source 314 that is coupled to the supply voltage 301. The first output circuit 211 for generating the control current 231 may comprise transistors 315, 316 (e.g. MOS transistors), which are controlled using the output signals 221, 222, respectively, to compare the output signals 221, 222. This comparison may be offset by the reference current offset which may be generated by a reference current offset current source 317 that is coupled to ground 302.

The transconductance $g_m$ of the V/I converter 109 (comprising the first output circuit 231) may be set by the $g_m$ of the input pair 304, 305 multiplied by the mirror ratios of the current mirrors formed by transistors 306, 308, transistors 307, 311 and transistors 309, 315. In the illustrated example, the transistors 315, 316 may have a size m=2. All the other transistors may have a size m=1. If the input pair 304, 305 is in weak inversion, $g_{m,in}$ may be well controlled. For temperature variations, a PTAT (proportional to absolute temperature) tail current may be used.

In the illustrated example, separate branches 212, 213, 211 are provided, which allows the offset between sleep and panic comparators and V/I converter to be well controlled. The intentional offset of the panic signal 233 depends on $g_{m,in}$ and the mirror ratios and can be set using the current source 314.

Figure 3B:
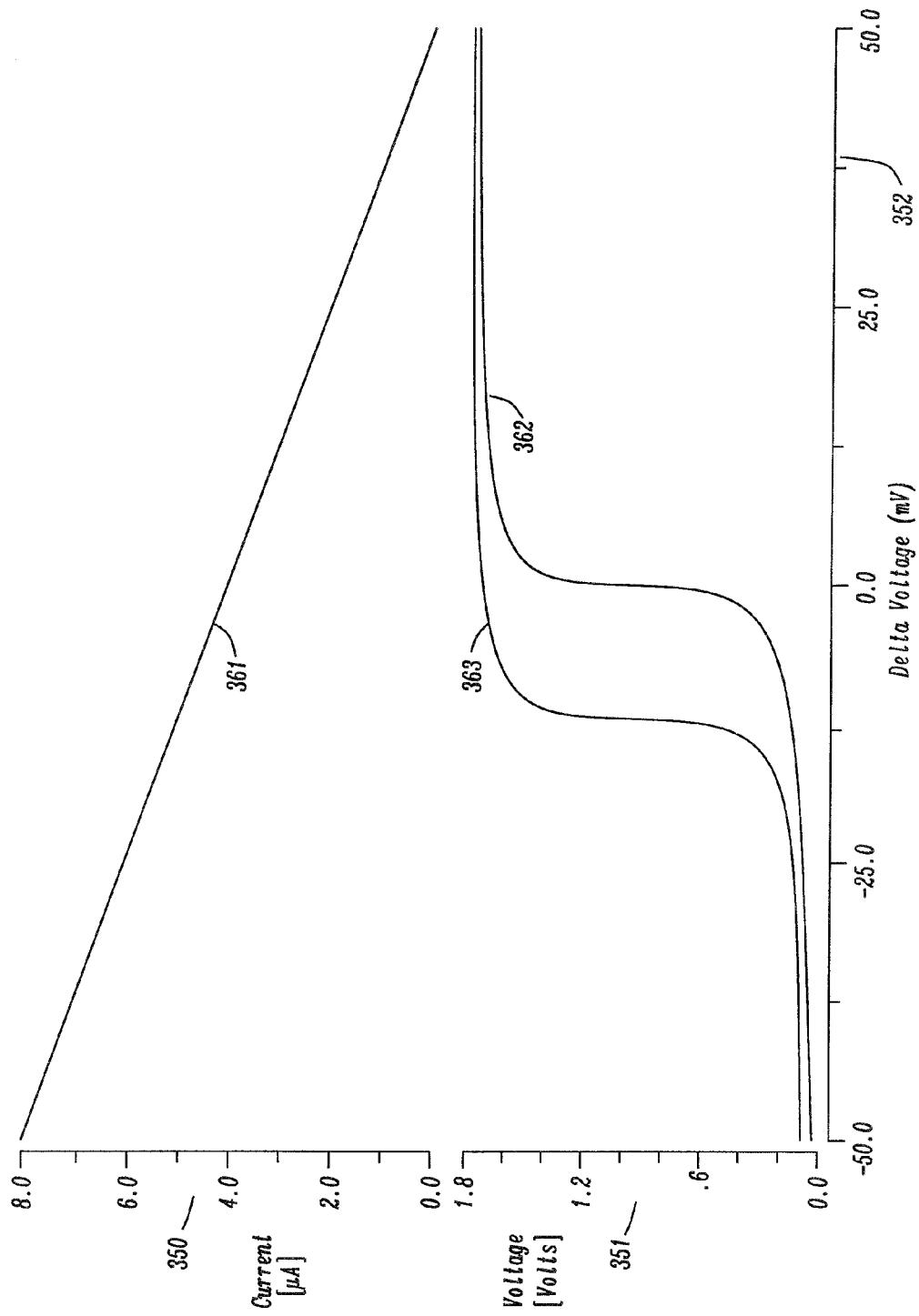
FIG. 3b shows example control signals.

In order to detect the falling edges of the first control voltage 232 and of the second control voltage 233 a comparator with relaxed offset requirements or a Schmitt trigger may be used. As can be seen in the simulations of FIG. 3b, the first control voltage 362 provides a substantial voltage step at the switching point (of a delta signal 352 of 0 mV). The delta voltage 352 corresponds to the difference between the feedback voltage 121 and the reference voltage 122. FIG. 3b shows the evolution of the control current 361 as a function of the delta voltage 352. The current 350 is shown in µA and the delta signal 352 is shown in mV. Furthermore, FIG. 3b shows the evolution of the second control voltage 363 and of the first control voltage 362. The voltage 351 is shown in V.

It should be noted that the sharing of the differential pair 304, 305 and other parts of the comparator circuit 200 also applies to different architectures e.g. with folded cascodes, differential voltage gain nodes and others.

By way of example, the current source 303 may provide 4 µA, and in an equilibrium situation, the current through the first input transistor 121 may be 2 µA and the current through the second input transistor 122 may be 2 µA. Furthermore, the current through the transistor 309 may be 2 µA and the current through the transistors 311, 313 may be 2 µA. The current through the transistor 316 may be 4 µA. The current provided by the current source 314 may be 0.5 µA and the current provided by the current source 317 may be 4 µA.

In the comparator circuit 200 of FIG. 3a, the different current mirrors, which are formed by the transistors of the output circuits 211, 212, 213 with the transistors of the pre-amplifier 205, may cause offsets (notably the transistors 310, 312, 315 and 311, 313, 316). In order to reduce these offsets, the configuration of FIG. 4a makes use of diodes 401, 402, 407, 408 in the current path. In this configuration, the "pre-amplifier" 205 may be considered to comprise the transistors 306, 307, 308, 311 and 304, 305, 309, 310, where the output signals 221, 222 are provided through the diodes 401, 402.

In case of an equal feedback voltage 121 and reference voltage 122, the current through these diodes 401, 402 changes its direction and provides a substantial voltage swing on the node between the transistors 310, 311, thereby providing the first control voltage 232. Using a current mirror 404, 405 and/or a first current source 403 for adding a first current and a second current source 406 for subtracting a second current, the second control voltage 233 may be provided. In the case of a certain under-voltage (e.g. a delta voltage of 10 mV as illustrated in FIG. 4b) the current through the diodes 407, 408 changes its direction and provides a relatively large voltage swing at the node between the transistors 406, 405, thereby providing the second control voltage 233. The offset voltage at which the second control voltage 233 exhibits a voltage swing may be controlled by the current setting of the second current source 406, by the current mirror ratios and/or by the $g_m$ of the input pair.

The first current source 403, the second current source 406 and a third current source 409 may be used to define the operating range of the control current 231 in case of a delta voltage of 0. The current mirror consisting of the transistors 404, 405 is preferably set precisely, because a mismatch of the current mirror may create an offset between the first control voltage 232 on one hand and the second control voltage 233 and/or the control current 231 on the other hand.

Figure 4A:
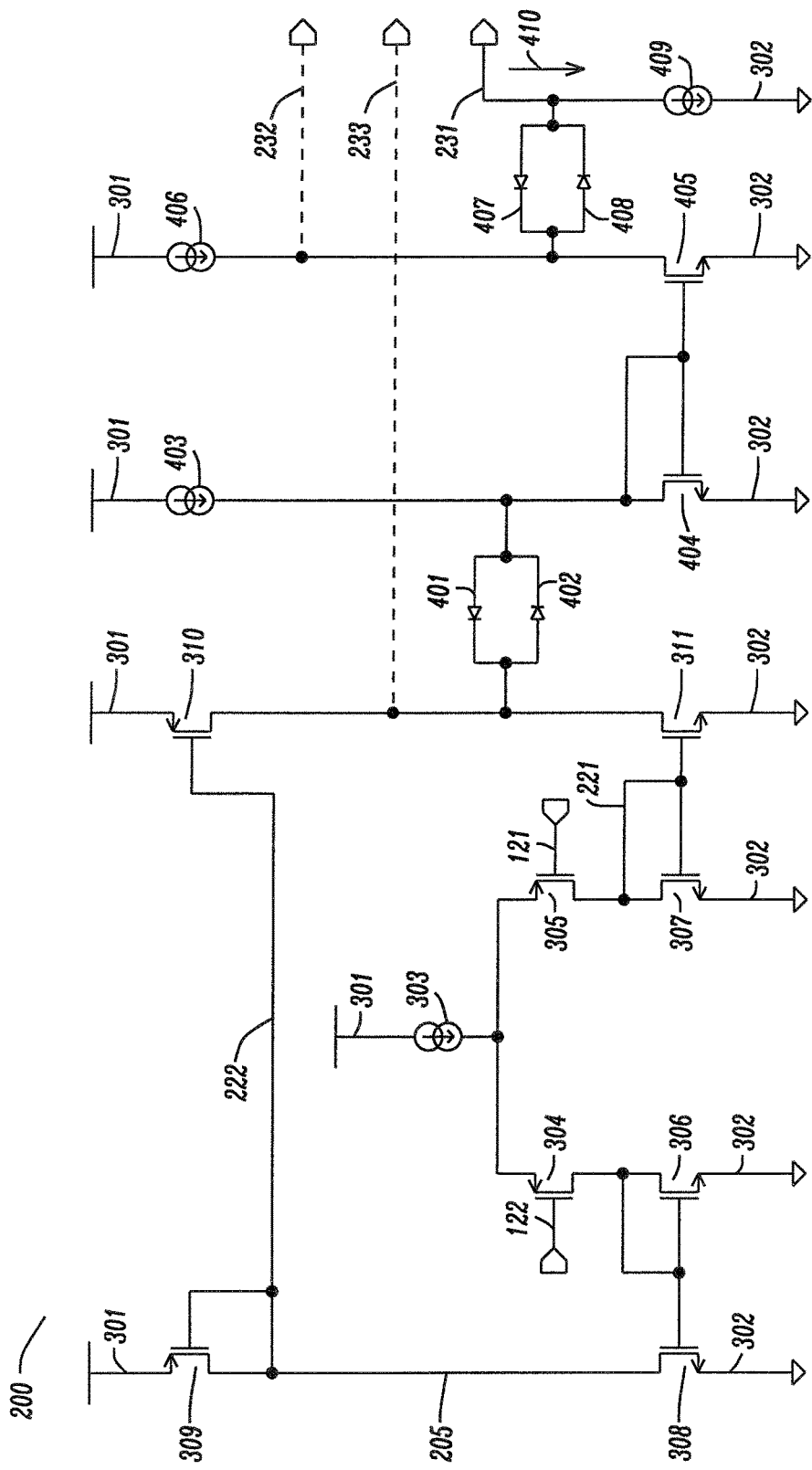
FIG. 4a shows a circuit diagram of another example comparator circuit.
Figure 4B:
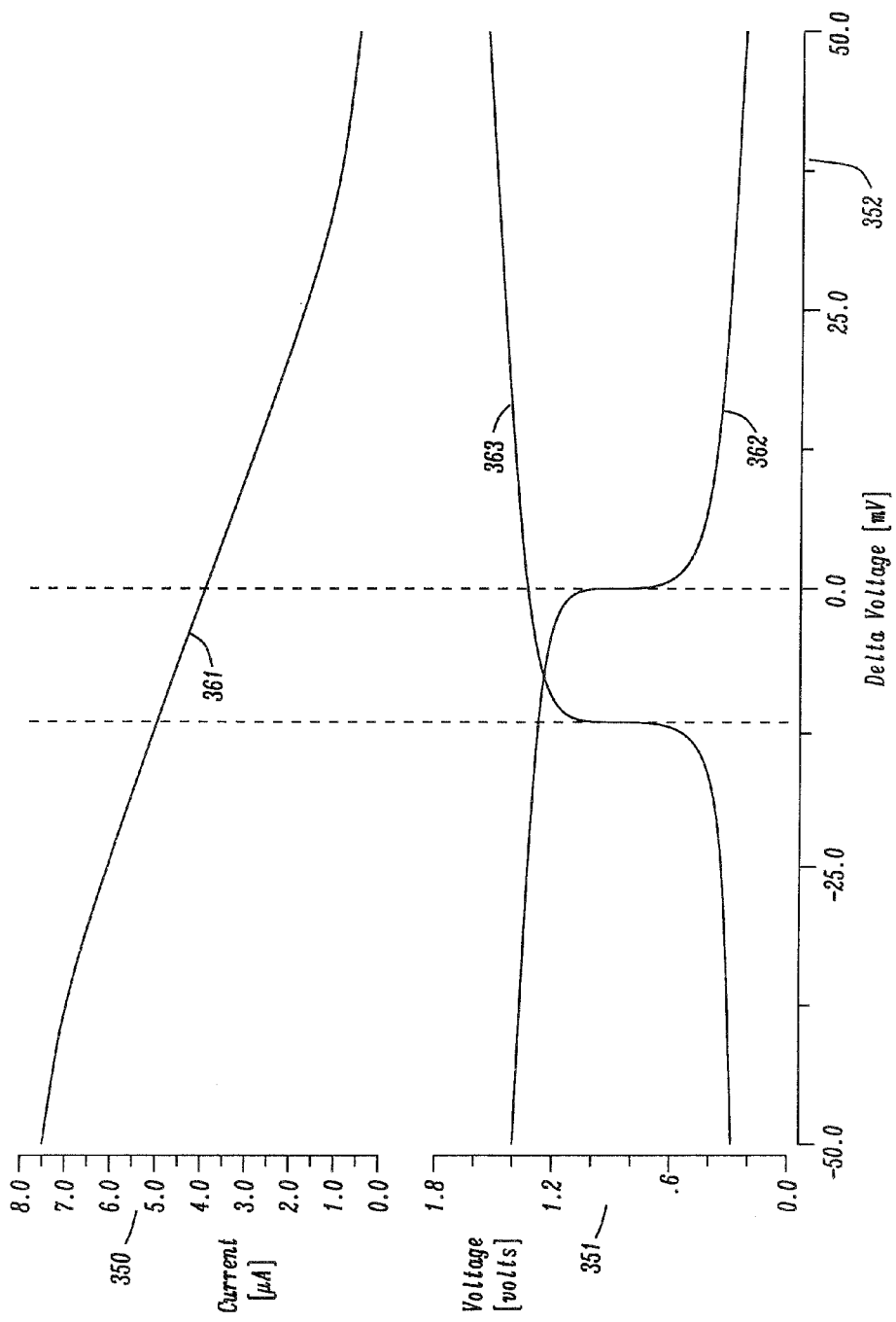
FIG. 4b shows example control signals.

FIG. 4b shows the control current 361, the second control voltage 363 and the first control voltage 362 for the comparator circuit 200 of FIG. 4a. The voltage swings may be detected using a Schmitt trigger or a comparator. These detectors are typically not sensitive to an offset. Typically, the delta voltage 352 is restricted to a linear region, where the control current 361 is related to the delta voltage 352 via a nearly constant gain.

Figure 4C:
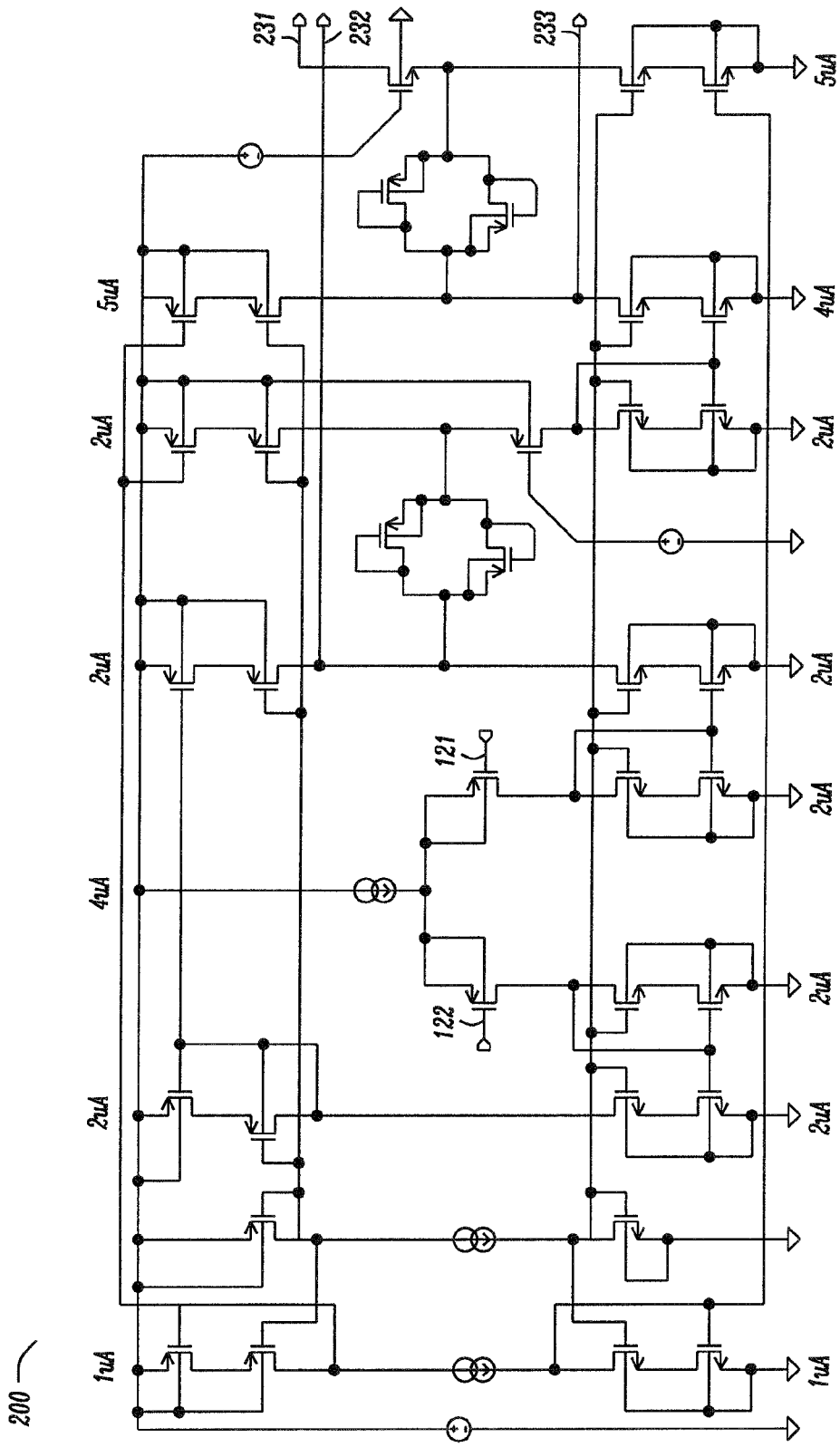
FIG. 4c shows a circuit diagram of another example comparator circuit.

FIG. 4c shows a schematic example of the comparator circuit 200 of FIG. 4a where the diodes 401, 402, 407, 408 are implemented using p-type MOS transistors and where cascades are used. Furthermore, FIG. 4c illustrates example currents (in µA) through the different branches of the comparator circuit 200. The voltage source which is depicted on the left side of FIG. 4c supplies the comparator circuit 200.

FIGS. 5a-1, 5a-2, 5a-3 show another example of a comparator circuit 200. The partial FIGS. 5a-1, 5a-2, 5a-3 are to be viewed side by side, with conducting lines being interconnected at the borders between the partial FIGS. 5a-1, 5a-2, 5a-3. The voltage source which is depicted on the left side of FIG. 5a-1 supplies the comparator circuit 200. The comparator circuit 200 of FIG. 5a has a dual-stage configuration. The first stage (i.e. the amplifier 205) is resistively loaded. The gain of this stage is defined by the $g_m$ of the input pair and the load resistances of the two branches of the input pair. In this case, the offset for the third output circuit 213 (e.g. for the panic comparator) may be obtained by adding an additional resistor tap to the first stage. The signals 521, 522, 523 of the different resistor taps are provided as output signals 221, 222 to the different output stages 211, 212, 213. If needed different resistor taps may also be added for the first output circuit 211 or for the second output circuit 212 to generate further offsets.

Figures 1, 5A:
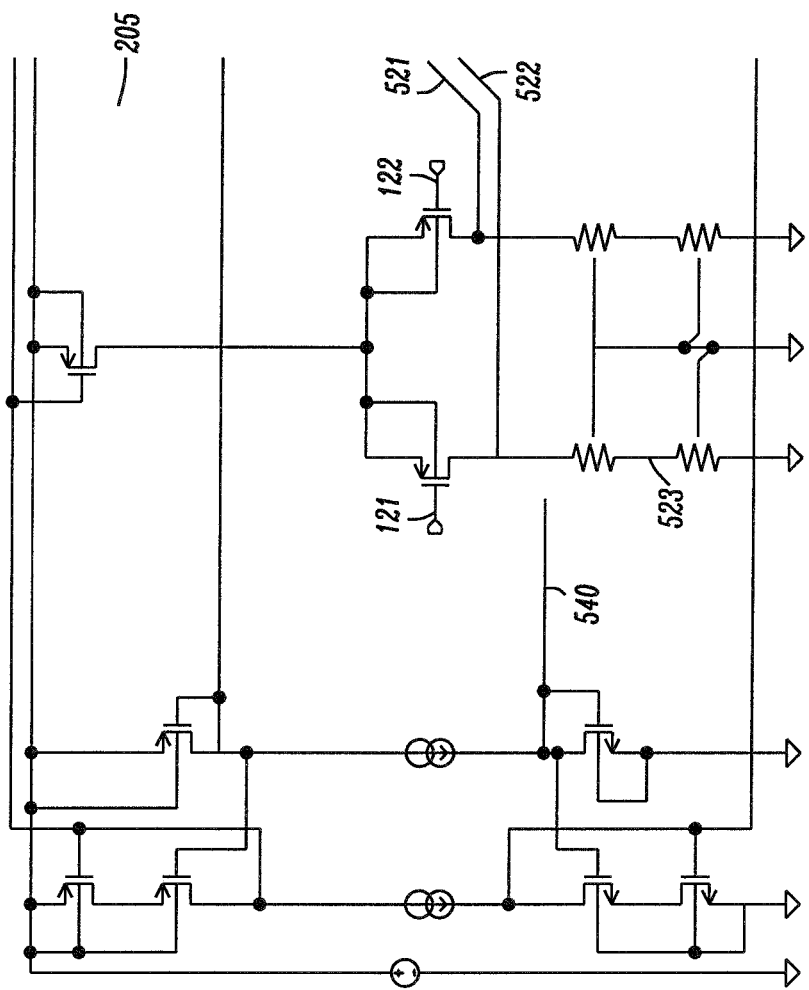
Figures 2, 5A:
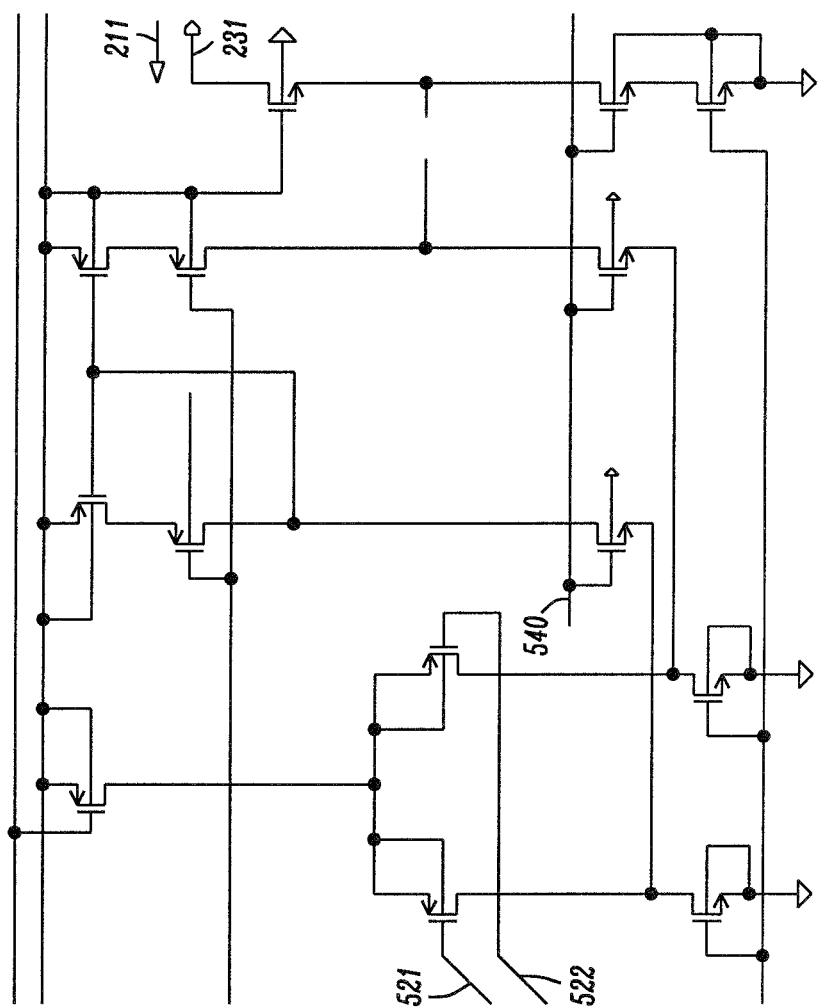
Figures 3, 5A:
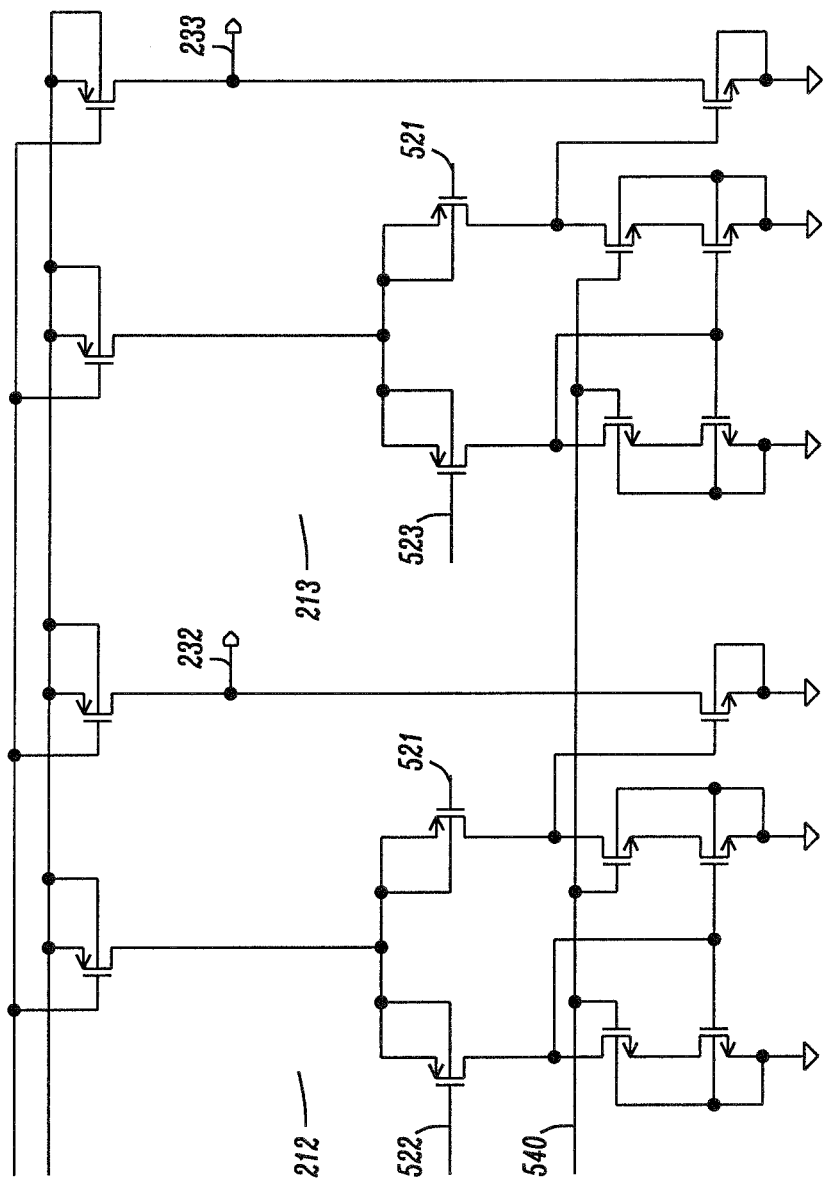

In the example of FIG. 5a the total transconductance for the OTA 109 is defined by the transconductances $g_m$ of the first input transistor, $g_m$ of the second input transistor of the pre-amplifier 205, the resistances of the pre-amplifier 205 and the $g_m$ of the transistors of the differential pair of the first output stage 211.

Figure 5B:
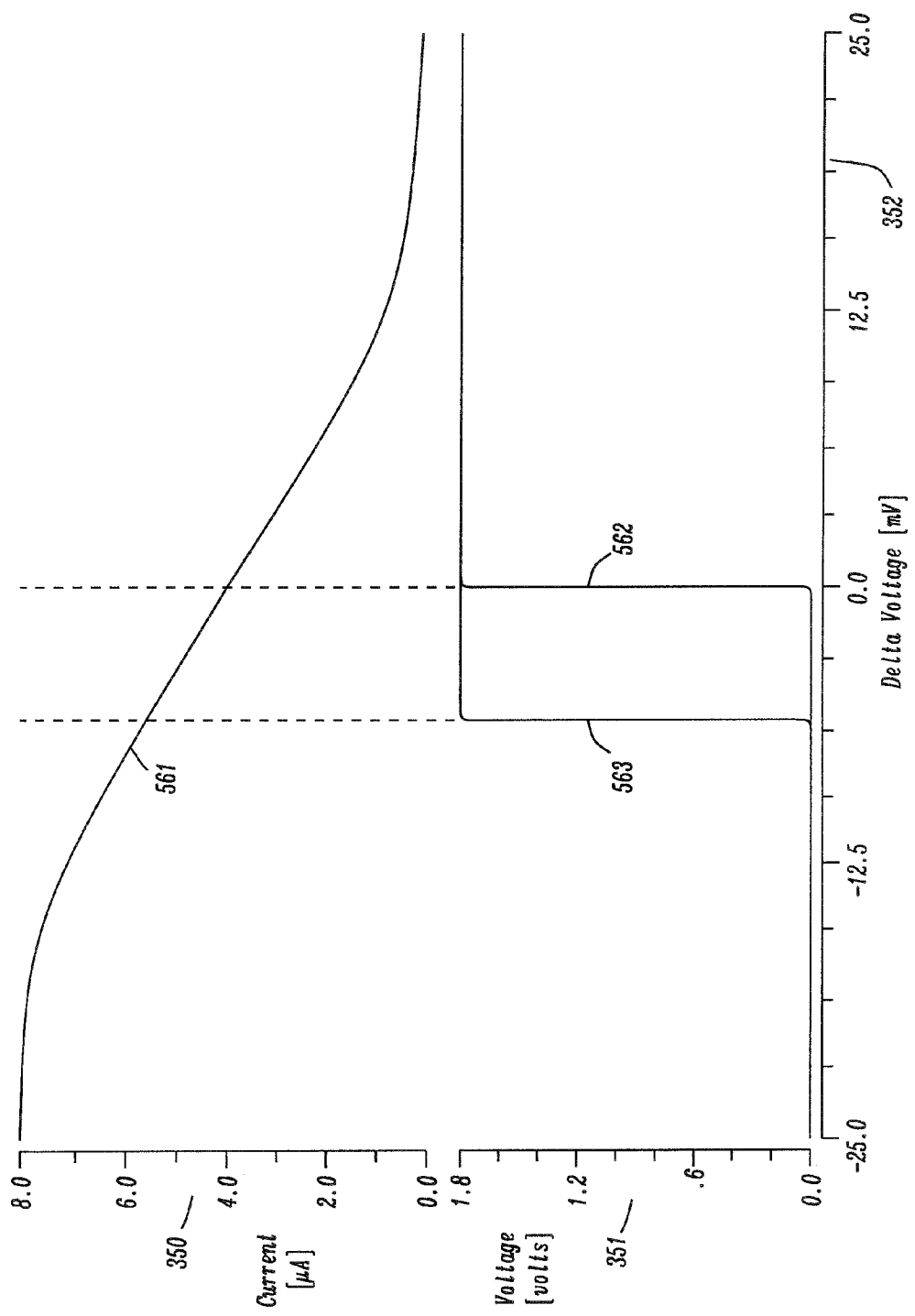
FIG. 5b shows example control signals.

FIG. 5b shows the control signals 561, 562, 563, i.e. the control current 561 and the first and second control voltages 562, 563. Schmitt triggers or other edge detection circuits may be used to detect the voltage swings of the control voltages 562, 563.

In general, the concept of combining components of an OTA 109 with one or more comparators 102 may be used in other contexts as well. By way of example, a circuit for detecting a point, where the input to an OTA 109 goes out of a (linear) range may be build using the principles which have been described in the present document. For this purpose comparator thresholds may be adapted.

Figure 6:
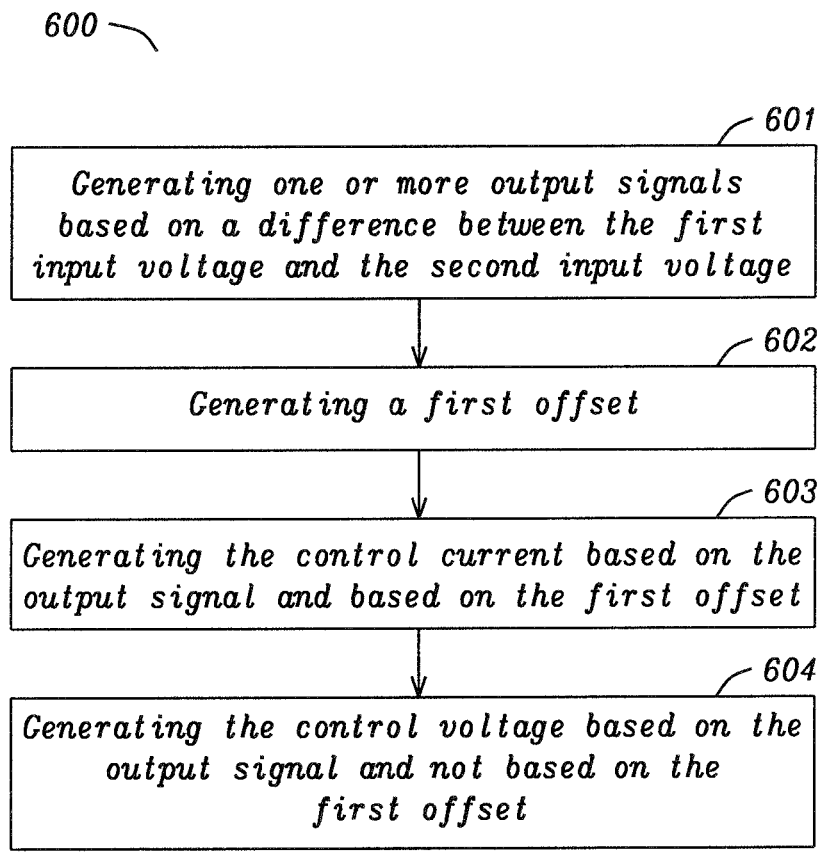
FIG. 6 shows a flow chart of an example method for providing a dynamic PFM mode.

FIG. 6 shows a flow chart of an example method 600 for providing a control current 231 (e.g. a reference current 126) and a control voltage 232 (e.g. an under-voltage signal 123 or a panic signal) based on a first input voltage 121 (e.g. the feedback voltage 121) and a second input voltage 122 (e.g. the reference voltage 122). The method 600 comprises generating 601 one or more output signals 221, 222 based on the first input voltage 121 and the second input voltage 122, notably based on a difference between the first input voltage 121 and the second input voltage 122. Furthermore, the method 600 comprises generating 602 a first offset. In addition, the method 600 comprises generating 603 the control current 231 based on the output signal 221, 222 and based on the first offset. In addition, the method 600 comprises generating 604 the control voltage 232 based on the output signal 221, 222 and not based on the first offset.

As such the control voltage 232 and the control current 231 are generated based on an output signal 221, 222 that has been generated using a joint pre-amplifier 205 (e.g. a joint differential input stage). By doing this, possible misalignments between the control voltage 232 and the control current 231 may be reduced. Furthermore, an intentional first offset, which is used for generating the control current 231, is applied subsequent to applying a joint amplifier 205. By doing this, misalignments between the control voltage 232 and the control current 231 which may be caused by an incorrect first offset may be reduced (notably in cases where the joint amplifier 205 applies an effective gain greater than one).

Figure 7:
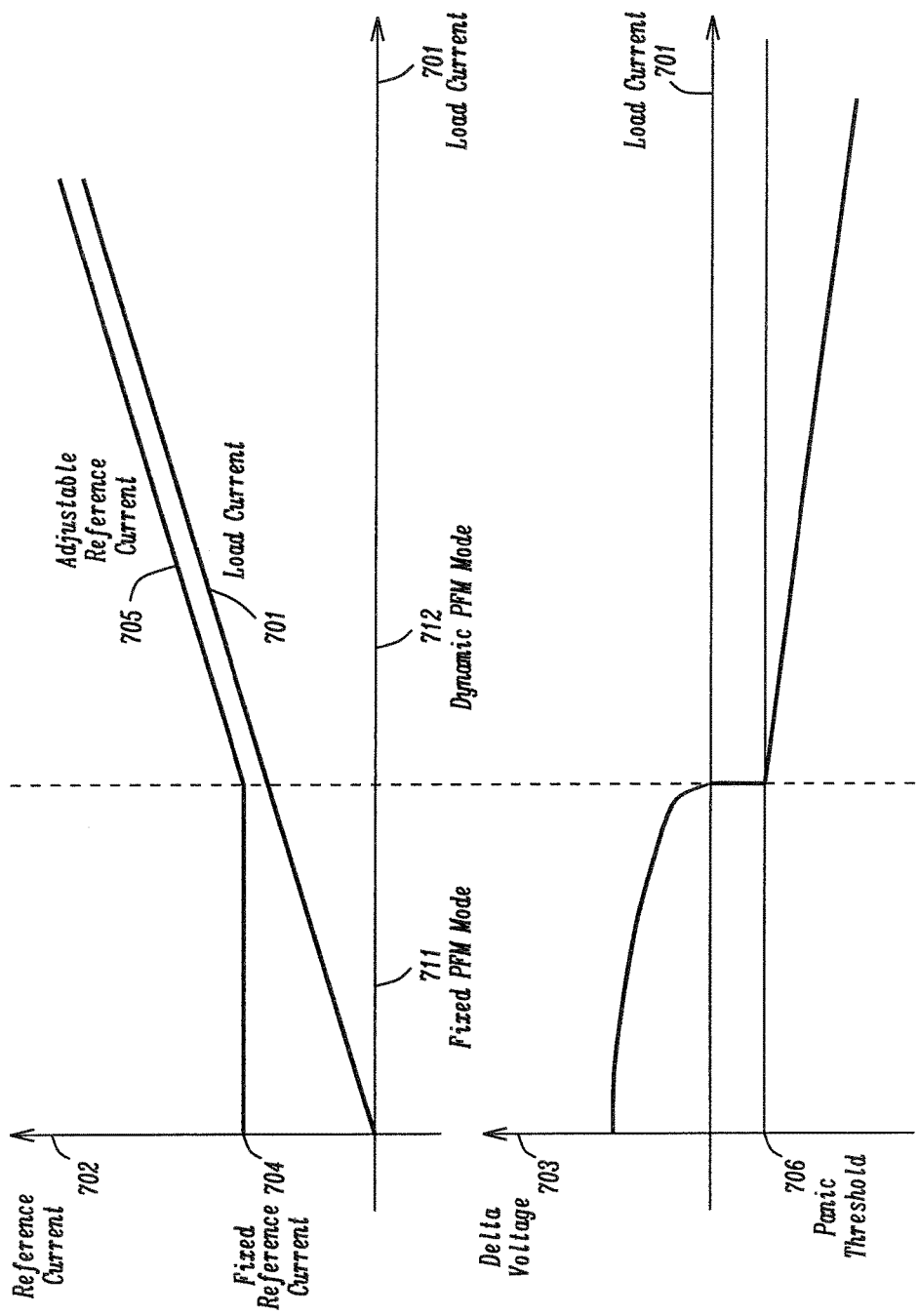
FIG. 7 illustrates a transition between a fixed PFM mode and a dynamic PFM mode.

FIG. 7 shows the operation of a power converter 100 in fixed PFM mode 711 and in dynamic PFM mode 712, as a function of the load current 701. It can be seen in the upper diagram that for relatively low load currents 701, the power converter 100 is operated in the fixed PFM mode 711 with a fixed reference current 702, 704, 126. The delta voltage 703 (i.e. the feedback voltage 121 minus the reference voltage 122) is positive. On the other hand, as the load current 701 increases, the fixed PFM mode 711 is not able to provide the requested load current 701 anymore. As a result of this, the delta voltage 703 drops to the panic threshold 706 and thereby triggers the activation of the dynamic PFM mode 712, where the reference current 702, 705, 126 is adjustable. It can be seen that due to an alignment between the control voltage 232 and the control current 231, there is a smooth transition between the fixed reference current 702, 704, 126 and the adjustable reference current 702, 705, 126.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A comparator circuit which is configured to provide a control current and a control voltage based on a first input voltage and a second input voltage, the comparator circuit comprising
   an input amplifier configured to generate an output signal based on a delta voltage which corresponds to a difference between the first input voltage and the second input voltage;
   offset means configured to generate a first offset;
   a first output circuit configured to generate the control current based on the output signal and based on the first offset; and
   a second output circuit configured to generate the control voltage based on the output signal and not based on the first offset; wherein the second output circuit is configured to generate the control voltage such that the control voltage exhibits a swing from a first potential to a second potential at a first delta voltage; and wherein the first output circuit is configured to generate the control current such that the control current is substantially linear for delta voltages within a pre-determined interval around the first delta voltage.

2. The comparator circuit of claim 1, wherein
   the control current exhibits a first current value at the first delta voltage; and
   the first current value is dependent on the first offset.

3. The comparator circuit of claim 1, wherein the input amplifier comprises a differential pair with a first input transistor which is controlled using the first input voltage and with a second input transistor which is controlled using the second input voltage.

4. The comparator circuit of claim 3, wherein
   the input amplifier is configured to provide a first output signal and a second output signal;
   the first output signal is dependent on a current through the first input transistor; and
   the second output signal is dependent on a current through the second input transistor.

5. The comparator circuit of claim 4, wherein
   the second output circuit comprises an upper transistor which is coupled to a supply voltage and a lower transistor which is coupled to ground;
   an upper transistor and a lower transistor are arranged in series;
   said lower transistor is controlled using the first output signal;
   said upper transistor is controlled using the second output signal; and
   the control voltage is dependent on a level of a midpoint between said lower transistor and said upper transistor.

6. The comparator circuit of claim 5, wherein the first output circuit is configured to generate the control current based on the level of the midpoint between said lower transistor and said upper transistor and based on the first offset.

7. The comparator circuit of claim 6, wherein the first output circuit is coupled to the midpoint between said lower transistor and said upper transistor via a diode function, wherein the diode function exhibits a forward voltage drop.

8. The comparator circuit of claim 1, further comprising
   second offset means configured to generate a second offset; and
   a third output circuit configured to generate a second control voltage based on the output signal and based on the second offset.

9. The comparator circuit of claim 1, wherein the input amplifier is configured to apply a gain, wherein the gain is greater than one.

10. A DC-DC power converter which is configured to provide an output current at an output voltage to a load at an output of the DC-DC power converter, wherein the DC-DC power converter comprises
    a high side switch and a low side switch which are arranged in series between a supply voltage and ground;
    an inductor which is arranged to couple a midpoint between the high side switch and the low side switch to the output of the DC-DC power converter;
    a control circuit which is configured to switch on or off the high side switch based on an under-voltage signal and based on a current-limit signal;
    a feedback loop configured to provide a feedback voltage based on the output voltage;
    a current sense circuit which is configured to provide a sensed current that is indicative of a current through the inductor;
    a comparator circuit which is configured to provide a control current and a control voltage based on a first input voltage and a second input voltage, the comparator circuit comprising
    an input amplifier configured to generate an output signal based on a delta voltage which corresponds to a difference between the first input voltage and the second input voltage;
    offset means configured to generate a first offset;
    a first output circuit configured to generate the control current based on the output signal and based on the first offset; and
    a second output circuit configured to generate the control voltage based on the output signal and not based on the first offset; wherein the second output circuit is configured to generate the control voltage such that the control voltage exhibits a swing from a first potential to a second potential at a first delta voltage; and wherein the first output circuit is configured to generate the control current such that the control current is substantially linear for delta voltages within a pre-determined interval around the first
    delta voltage
    which is configured to provide the under-voltage signal and a reference current based on the feedback voltage and based on a reference voltage; wherein the current-limit signal is dependent on the sensed current and on the reference current.

11. The DC-DC power converter of claim 10, wherein the control circuit is configured to
    turn on the high side switch, if the under-voltage signal indicates that the feedback voltage is lower than the reference voltage by at least a pre-determined under-voltage threshold;

turn off the high side switch, if the current-limit signal indicates that the sensed current reaches the reference current; and maintain the high side switch off for at least a pre-determined off-time.

12. The DC-DC power converter of claim 10, wherein the comparator circuit is configured to determine whether the feedback voltage is lower than the reference voltage by at least a pre-determined panic threshold;

generate a fixed reference current, if the feedback voltage is not lower than the reference voltage by at least the pre-determined panic threshold; and generate an adaptive reference current which is dependent on a difference between the feedback voltage and the reference voltage, if the feedback voltage is lower than the reference voltage by at least the pre-determined panic threshold.

13. The DC-DC power converter of claim 12, wherein the comparator circuit comprises offset means configured to provide one or more offsets;

the pre-determined panic threshold and the reference current are dependent on the one or more offsets; and the one or more offsets are such that the adaptive reference current substantially corresponds to the fixed reference current if the feedback voltage is lower than the reference voltage by the pre-determined panic threshold.

14. A method for providing a control current and a control voltage based on a first input voltage and a second input voltage, the method comprising generating an output signal based on the first input voltage and the second input voltage;

generating a first offset;

generating the control current based on the output signal and based on the first offset; and generating the control voltage based on the output signal and not based on the first offset; wherein the control voltage is generated such that the control voltage exhibits a swing from a first potential to a second potential at a first delta voltage; and wherein the control current is generated such that the control current is substantially linear for delta voltages within a pre-determined interval around the first delta voltage.

15. The method of claim 14, further comprising the steps of:

generating by the second output circuit the control voltage such that the control voltage exhibits a swing from a first potential to a second potential at a first delta voltage; and generating by the first output circuit the control current such that the control current is substantially linear for delta voltages within a pre-determined interval around the first delta voltage.

16. The method of claim 15, wherein the control current exhibits a first current value at the first delta voltage; and the first current value is dependent on the first offset.

17. The method of claim 16, wherein the input amplifier comprises a differential pair with a first input transistor which is controlled using the first input voltage and with a second input transistor which is controlled using the second input voltage.

18. The method of claim 17, wherein the input amplifier provides a first output signal and a second output signal;

the first output signal is dependent on a current through the first input transistor; and the second output signal is dependent on a current through the second input transistor.

19. The method of claim 18, wherein the second output circuit comprises an upper transistor which is coupled to a supply voltage and a lower transistor which is coupled to ground;

the upper transistor and the lower transistor are arranged in series;

the lower transistor is controlled using the first output signal;

the upper transistor is controlled using the second output signal; and the control voltage is dependent on a level of a midpoint between the lower transistor and the upper transistor.

20. The method of claim 19, further comprising the step of:

generating by the first output circuit the control current based on the level of the midpoint between the lower transistor and the upper transistor and based on the first offset.

21. The method of claim 20, further comprising the step of:

coupling the first output circuit to the midpoint between the lower transistor and the upper transistor via a diode function, wherein the diode function exhibits a forward voltage drop.

22. The method of claim 14, further comprising the steps of:

generating by second offset means a second offset; and generating by a third output circuit a second control voltage based on the output signal and based on the second offset.

23. The method of claim 14, further comprising the step of:

applying by an input amplifier a gain, wherein the gain is greater than one.

* * * * *